United States Patent
Bauer et al.

(10) Patent No.: US 6,285,496 B1
(45) Date of Patent: Sep. 4, 2001

(54) OPTICAL MOUNT WITH UV ADHESIVE AND PROTECTIVE LAYER

(75) Inventors: Harry Bauer, Aalen-Ebnat; Sascha Kraus, Aalen; Hans G Keck, Heidenheim; Jörg Endler, Heubach; Hans-Joachim Weippert, Aalen, all of (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/568,224

(22) Filed: May 9, 2000

Related U.S. Application Data

(62) Division of application No. 09/126,693, filed on Jul. 30, 1998, now Pat. No. 6,097,536.

(30) Foreign Application Priority Data

Aug. 1, 1997 (DE) .............................................. 197 33 490

(51) Int. Cl.$^7$ ..................................................... G02B 0/00
(52) U.S. Cl. ........................ 359/350; 359/361; 359/819; 359/359
(58) Field of Search .................................. 359/350, 361, 359/359, 358, 819, 722

(56) References Cited

U.S. PATENT DOCUMENTS 5,493,442 * 2/1996 Buchholz et al. ................... 359/359

FOREIGN PATENT DOCUMENTS

| 09184917 | * | 8/1987 | (JP) | ..................................... 359/361 |
| 62184079 | * | 8/1987 | (JP) | ..................................... 359/361 |

* cited by examiner

*Primary Examiner*—Darren Schuberg
*Assistant Examiner*—Fayez Assaf

(57) ABSTRACT

An assembly includes a holder made of material selected from metal and ceramic/glass ceramic, a transparent optical component that is transparent in the ultraviolet (UV) wavelength region of light, which has functional faces serving for transmission, and adhesive that is hardenable by UV light of a given long wavelength region, a layer applied by thin film technology and fixed to the holder by the adhesive. The layer is provided only outside said functional faces and to a high degree at least reflects or absorbs radiated light in a predetermined UV wavelength region within the UV wavelength region transmitted by the transparent optical component, and is transparent in the given long wavelength region to harden the adhesive by UV light irradiation that passes through the transparent optical component and the layer.

7 Claims, 2 Drawing Sheets

OPTICAL MOUNT WITH UV ADHESIVE AND PROTECTIVE LAYER

This application is a divisional of prior application Ser. No. 09/126,693, filed Jul. 30, 1998. Now U.S. Pat. No. 6,097,536.

BACKGROUND OF INVENTION

1. Field of the Invention

The invention relates to an assembly including a holder—in particular, a mount—and a transparent, preferably optical, component that transmits in the ultraviolet spectral region, and more particularly to an assembly in which an adhesive can be hardened by means of UV light within a given spectral distribution.

2. Discussion of Relevant Art

Japanese Patent document 8-72300 provides an example of such an assembly with an ultraviolet curable adhesive. Such assemblies form, among other things, mounted lenses and the like of illumination systems and projection systems for microlithography.

Adhesive bonding to a mount is known, for example, for automobile and architectural glass, wherein the adhesive is protected from the effects of solar IN irradiation by means of UV-absorbing fillers and protective layers.

Thin layers of dielectrics, and in protective layers with thicknesses in the micrometer range, are known in the optical field, and are applied by vacuum deposition, sputtering, PVD or CVD. Such a protective layer for UV hardening bonds is described in Japanese Patent publication 9-184917.

According to Naumann, Schroder, Constructional Elements of Optics, Munich and Vienna 1983, page 72, such layers of cryolite, magnesium fluoride, cerium fluoride, zinc sulfide and titanium dioxide have lower transmission limits of 0.12 to 0.4 $\mu$m. Tantalum pentoxide, hafinium dioxide and mixtures of them transmit from 0.3 $\mu$m or 0.32 $\mu$m, according to Soviet Patent Document SU 48 23 642/33.

In general, the exact reflection, absorption, and transmission spectra of these thin layers in the Deep Ultianolet (DUV) region are not known, since the effects of the substrate and of the spectrometer/monochromator components are difficult to detect, and these materials have not been tested outside the planned field of application.

It has been found that the known mount adhesives based on epoxy resin, which can be hardened with UV light of the Hg-I line, can be considerably damaged by irradiation with DUV light at 248 nm and even more at 193 nm, in DV projection exposure equipment, and by their failure limit the life of the equipment.

DUV absorbing fillers in the adhesive mass do not prevent failure of the boundary layer of the adhesive adjacent to the quartz glass.

SUMMARY OF INVENTION

The object of the invention is to provide an assembly of the stated kind, in which the adhesive can be hardened with UV light, particularly the Hg-I line, and is also stable against UV light in useful spectral regions, especially in the short wavelength DUV region. The reflection of light from the region of the adhesive is to be suppressed as far as possible, since such scattered light has a troublesome effect in the optics. A process for producing the assembly and use of the assembly also are objectives of the invention.

This object is achieved by an assembly having a holder, a transparent component that transmits in the ultraviolet (UV) spectral region and is adhered by means of an adhesive that is hardenable by UV light in a given spectral region, and a layer that is applied by thin film technology on the transparent component in a region of the adhesive and transmits UV light of the given spectral region suitable for hardening the adhesive and to a high degree obstructs transmission of UV light within a useful spectral region by absorbing and/or reflecting light within the UV spectral region transmitted by the transparent component.

The production process according to the invention involves producing a transparent optical component attached to a mount by means of UV-hardenable adhesive by selecting a thin film layer to transmit light suitable for hardening the adhesive and to a high degree obstruct transmission of UV light in a useful spectral region by absorption and/or reflection, within the spectral regions transmitted by the optical component, and covering the component with a thin layer in the region of the adhesive by means of tin film technology. The assembly can be used in microlithogrophy projection exposure equipment Thus, staring from the established mounting technique with UV hardening adhesives, by the introduction of a single coating, that can be integrated with the treatment for application of anti-reflection layers, which is required in abase, it is possible to permanently mount the lens that is suitable for DUV.

BRIEF DESCRIPTION OF THE DRAWINGS

The invention will be described in further detail taken together the accompanying drawings, in which.

DETAILED DESCRIPTION OF PREFERRED EMBODIMENTS

Figure 1:
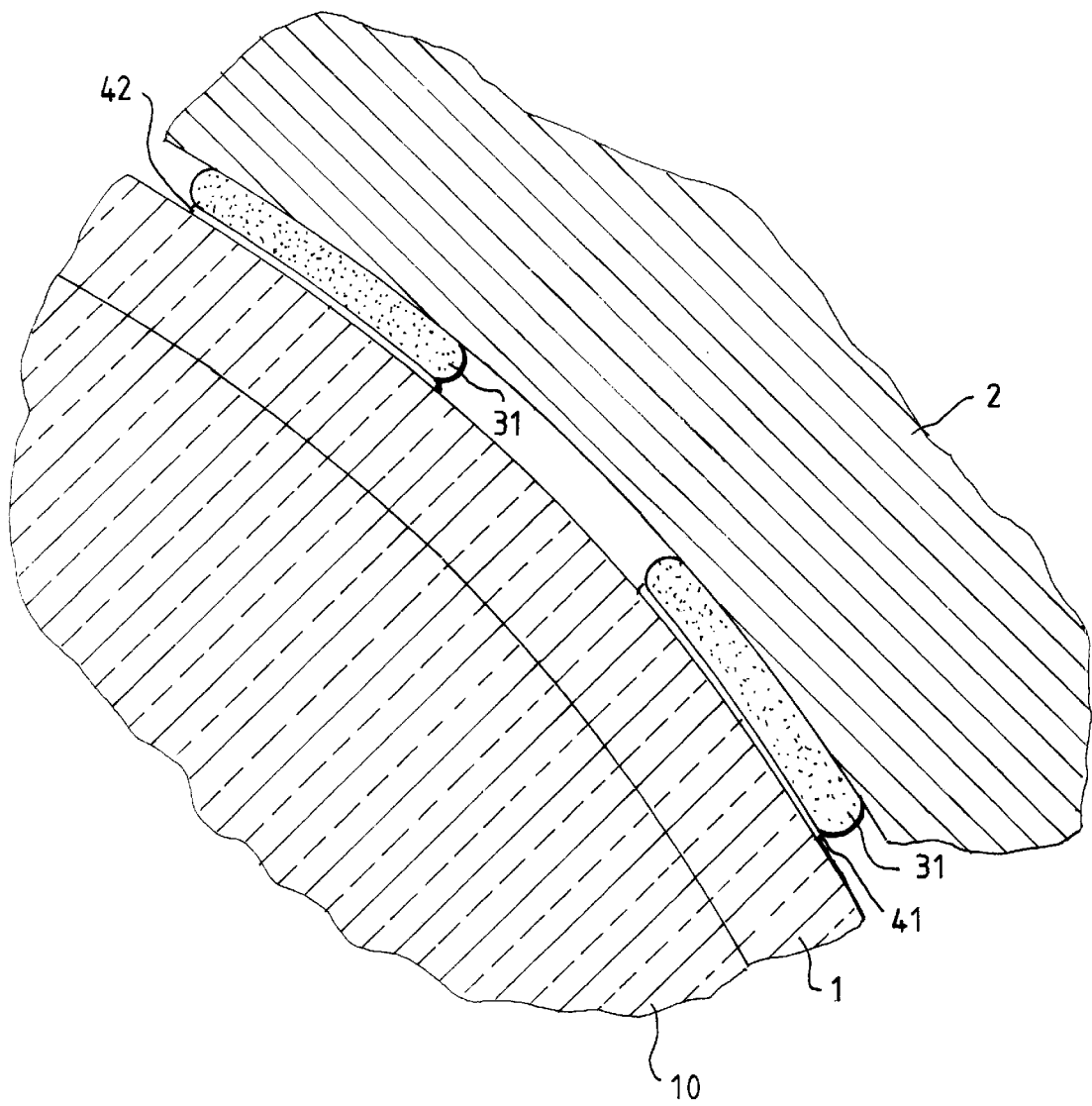
FIG. 1 shows an assembly according to the invention, in a schematic detail view.

The assembly schematically shown in FIG. 1 has a transparent component 1, namely a lens, a flat plate, a prism, a Mangin mirror or a transmitting diffractive optical element in a mount 2, made of metal or cermic/glass-ceramic, which is not Uv transparent. These parts, 1 and 2, are connected together by layers 31, 32 of adhesive, which are formed as distributed sections over the edge of the transparent component 1, or as a continuous layer throughout. The adhesive layers 31, 32 consist of UV-hardenable (or UV-hardened) adhesive based on epoxy resin, such as, e.g., Omnifit UV-4000 of Omnitechnic GmbH, Hannover.

The adhesive in this arrangement can be hardened through the transparent optical component 1 with Hg-I light of a high-pressure mercury lamp.

Since the adhesive is photochemically unstable to light with shorter wavelengths, in particular, the light from excimer lasers at 248 nm or 193 nm—as is required in projection exposure equipment for microlithography of the latest constructional forms—an adhesive-protecting layer 41, 42 for each layer of adhesive 31, 32 is required and is provided according to the invention. This can either be applied at the place of the later adhesion, or on the opposing surface of the transparent component 1.

A thin layer of tantalum pentoxide ($Ta^2O^5$), for example, is suitable, and can be applied like an optical layer (for anti-reflection and the like). It can, for example, be vapor deposited in a vacuum as a single layer.

The thickness is determined as n×$\lambda$/2 for the optical path length at the hardening wavelength of 365 nm with n=1 for the useful wavelength of 193 nm or n=2 for the useful wavelength of 248 nm.

There are thereby attained a high transmission of more than 85% at the hardening wavelength of 365 nm, a very low transmission, under 2%, at the useful wavelength of 248 nm and thereunder, and at the same time a high absorption and a small reflection throughout, in both spectral regions.

Figure 2:
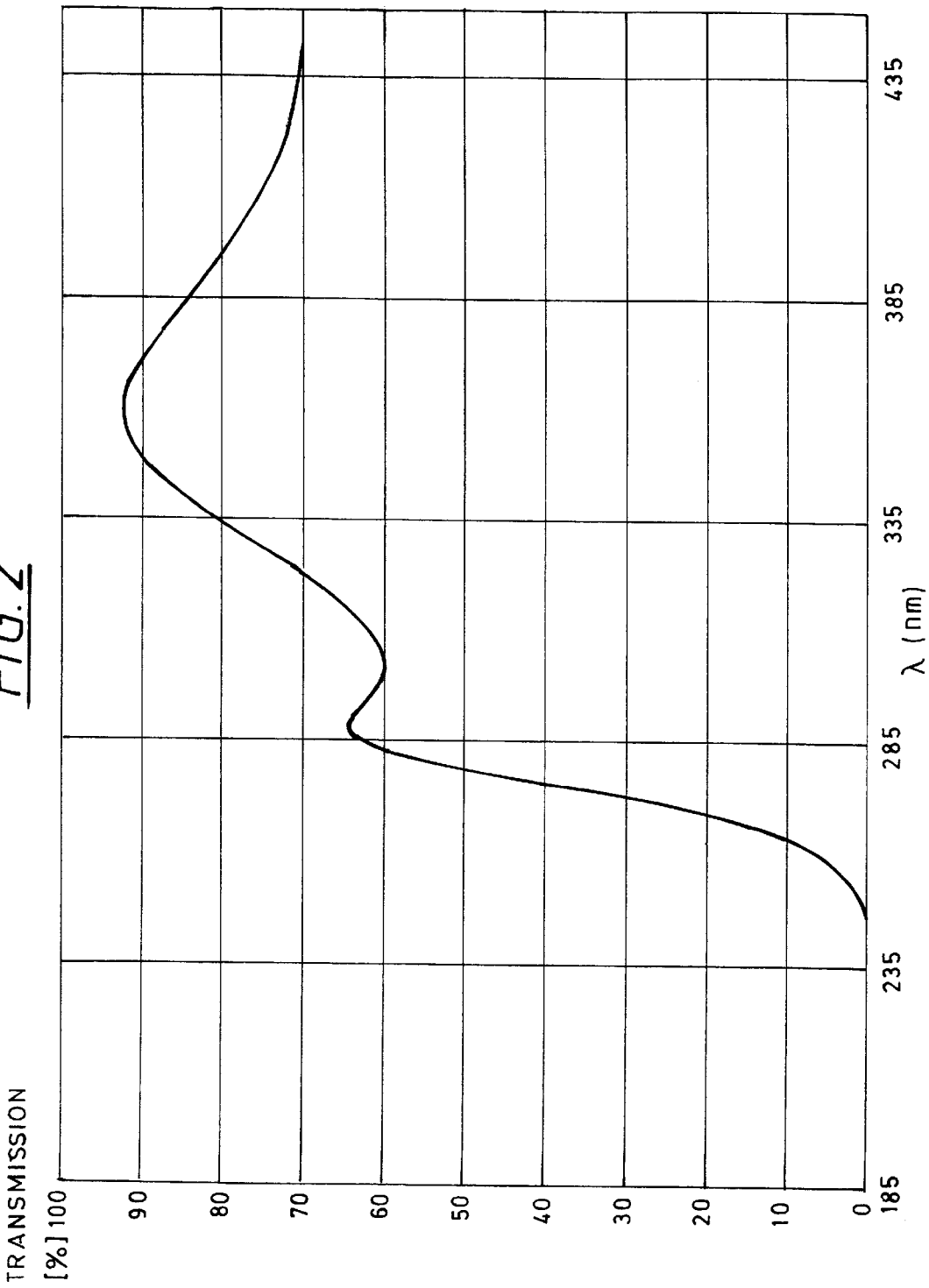
FIG. 2 shows the transmission spectrum of a suitable $Ta_2O_5$ layer.

FIG. 2 shows the transmission spectrum of such a tantalum pentoxide layer on Suprasil quartz glass, measured at 7° to the surface normal.

A further reduction of the reflection can be attained by targeted multiple layers anti-reflection layers).

The tensile strength and tensile shear strength of the layer should be at least 10 N/mm$^2$ on quartz glass, so that the adhesive strength of the adhesive bonding is not reduced.

The layer is chemically stable under the environmental conditions during the production and operation of DUV projection exposure equipment for microlithography.

Such an assembly coated with tantalum pentoxide now withstands an irradiation with 248 nm DUV light so well that the life of the whole system is not limited by the life of the adhesive bonding.

It is quite important for the functioning of the optical component 1 that the functional surfaces 10 serving for transmission are not contaminated with the absorbing tantalum pentoxide layer. The vapor deposition therefore takes place with an apparatus which hermetically seals these surfaces 10, e.g. with elastically tensioned annular blades.

The adhesive-protecting layer 41, 42 is preferably applied before the anti reflection layers for the transmitting surfaces 10, so that a possible contamination is less serious.

The use of tantalum pentoxide on quartz glass, and also the wavelengths of 365 nm, 248 nm or 193 nm are preferred examples here. Other suitable materials, whose transmission decreases in the DUV region, are described as examples in the above introduction. Mixtures of materials are also relevant, as shown in the cited Soviet Patent document.

Besides quartz glass and the like as the transparent substrate, calcium fluoride and germanium dioxide glass (as described in German Patent Document DE 196 33 128.5 of Schuster) are also suitable.

In addition to the use in projection microlithography, the assemblies according to the invention are also especially suitable for DUV laser optics, especially for exit windows of excimer lasers.

We claim:

1. An assembly comprising:
   a transparent optical element adhered to a mount made of material selected from metal and ceramic/glass ceramic by a UV-hardenable adhesive in which said transparent optical element bears in a region of said adhesive, a thin layer that transmits more than 60% at a Hg-1 line and transmits less than 5% at wavelengths below 250 nm.

2. The assembly according to claim 1, in which said thin layer transmits less than 2% at wavelengths below 250 nm.

3. An assembly, comprising:
   a holder made of material selected from metal and ceramic/glass ceramic,
   a transparent optical component that is transparent in the ultraviolet (UV) wavelength region of light, which has functional faces serving for transmission, and adhesive that is hardenable by UV light of a given long wavelength region, a layer applied by thin film technology and fixed to said holder by said adhesive, in which said layer is provided only outside said functional faces and to a high degree at least reflects or absorbs radiated light in a predetermined UV wavelength region within said UV wavelength region transmitted by said transparent optical component, and is transparent in said given long wavelength region to harden said adhesive by UV light irradiation that passes through said transparent optical component and said layer.

4. A process for producing a transparent optical component attached to a mount by means of UV-hardenable adhesive, comprising:
   selecting a thin layer to transmit light in a given spectral region suitable for hardening said adhesive and to a high degree obstruct transmission of UV light in a predetermined spectral region by at least absorption or reflection, within a spectral region transmitted by said optical component, and
   covering said optical component with said thin layer in a region of said adhesive by thin film technology.

5. The process according to claim 4, in which said selecting step comprises selecting a thin layer to obstruct transmission of UV light in said predetermined spectral region that is of shorter wavelength than said given spectral region.

6. The process according to claim 4, in which said selecting step comprises selecting a single thin layer.

7. The process according to claim 4, in which said covering step is selected from the group consisting of vapor deposition, sputtering with ion support, sputtering without ion support, physical vapor deposition (PVD) and chemical vapor deposition (CVD).

\* \* \* \* \*